(12) United States Patent
Chen et al.

(10) Patent No.: US 6,411,524 B1
(45) Date of Patent: Jun. 25, 2002

(54) DUAL PLANAR PRINTED WIRING BOARD FOR COMPACT FLUORESCENT LAMP

(75) Inventors: Timothy Chen, Germantown, TN (US); James K. Skully, Willoughby, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/679,020

(22) Filed: Oct. 4, 2000

(51) Int. Cl.[7] ................................................ H05K 1/14
(52) U.S. Cl. ..................... 361/803; 361/760; 361/784; 361/807; 362/221; 362/216; 315/309; 315/61; 315/58
(58) Field of Search ................................. 315/309, 327, 315/262, 56, 58, 61; 362/216, 221; 361/784, 803, 761, 807, 821, 830

(56) References Cited

U.S. PATENT DOCUMENTS

| 4,360,762 A | 11/1982 | Yamamoto et al. |
| 4,393,435 A | 7/1983 | Petrina |
| 4,527,098 A | 7/1985 | Owen |
| 4,729,740 A | 3/1988 | Crowe et al. |
| 4,766,406 A | 8/1988 | Kurgan et al. |
| 4,792,729 A | 12/1988 | Peters |
| 4,897,627 A | 1/1990 | Van Wagener et al. |
| 4,924,152 A | 5/1990 | Flickinger |
| 5,019,938 A | 5/1991 | Sridharan et al. |
| 5,164,635 A | * 11/1992 | De Jong et al. ............... 315/58 |
| 5,473,517 A | 12/1995 | Blackman |
| 5,541,477 A | 7/1996 | Maya et al. |
| 5,545,950 A | 8/1996 | Cho |
| 5,569,981 A | 10/1996 | Cho |
| 5,627,433 A | 5/1997 | Fulop et al. |
| 5,629,581 A | * 5/1997 | Belle et al. .................. 313/318 |
| 5,713,655 A | 2/1998 | Blackman |
| 5,762,509 A | 6/1998 | Kang |
| 5,814,945 A | * 9/1998 | Hsu ........................... 315/158 |

FOREIGN PATENT DOCUMENTS

EP 0590512 A1 * 9/1993

* cited by examiner

Primary Examiner—David Martin
Assistant Examiner—Hung Bui
(74) Attorney, Agent, or Firm—Pearne & Gordon LLP

(57) ABSTRACT

A printed wiring board assembly for a compact fluorescent lamp unit that has a lamp portion and a base portion includes a first generally planar wiring board containing a first group of electronic components electrically connected to the lamp portion and a second generally planar wiring board containing a second group of electronic components electrically connected to the base portion. The first board is attached generally perpendicular to the second board and is in electrical communication with the second board.

5 Claims, 4 Drawing Sheets

DUAL PLANAR PRINTED WIRING BOARD FOR COMPACT FLUORESCENT LAMP

BACKGROUND OF THE INVENTION

This invention relates to compact fluorescent lamps and, in particular, to a printed wiring board assembly therefor.

Self-ballasted screw-in compact fluorescent lamp units have become increasingly popular. In order to further develop this market it is desirable to provide units with all of the features commonly available with other light sources such as incandescent lamps. These features include, for example, multiple output levels, including full range dimming. Unfortunately, providing these features increases the complexity, part count and size of the power supply/control circuits in these lamps.

Heretofore the printed wiring circuit boards for these power supply/control circuits have been in the form of planar boards in either a generally "horizontal" configuration or a generally "vertical" configuration. To be acceptable to the consumer, the lamp units need to conform generally to the form factor of incandescent lamps, i.e., a relatively wide light emitting portion tapering to a narrow mounting base. Besides being acceptable to the consumer, this form factor also helps insure that the lamp units can be installed in existing fixtures.

The present invention allows this form factor to be maintained while still providing sufficient space for the necessary circuitry.

SUMMARY OF THE INVENTION

A printed wiring board assembly for a compact fluorescent lamp unit that has a lamp portion and a base portion includes a first generally planar wiring board containing a first group of electronic components electrically connected to the lamp portion and a second generally planar wiring board containing a second group of electronic components electrically connected to the base portion. The first board is attached generally perpendicular to the second board and is in electrical communication with the second board.

DESCRIPTION OF THE PREFERRED EMBODIMENTS

Figure 1:
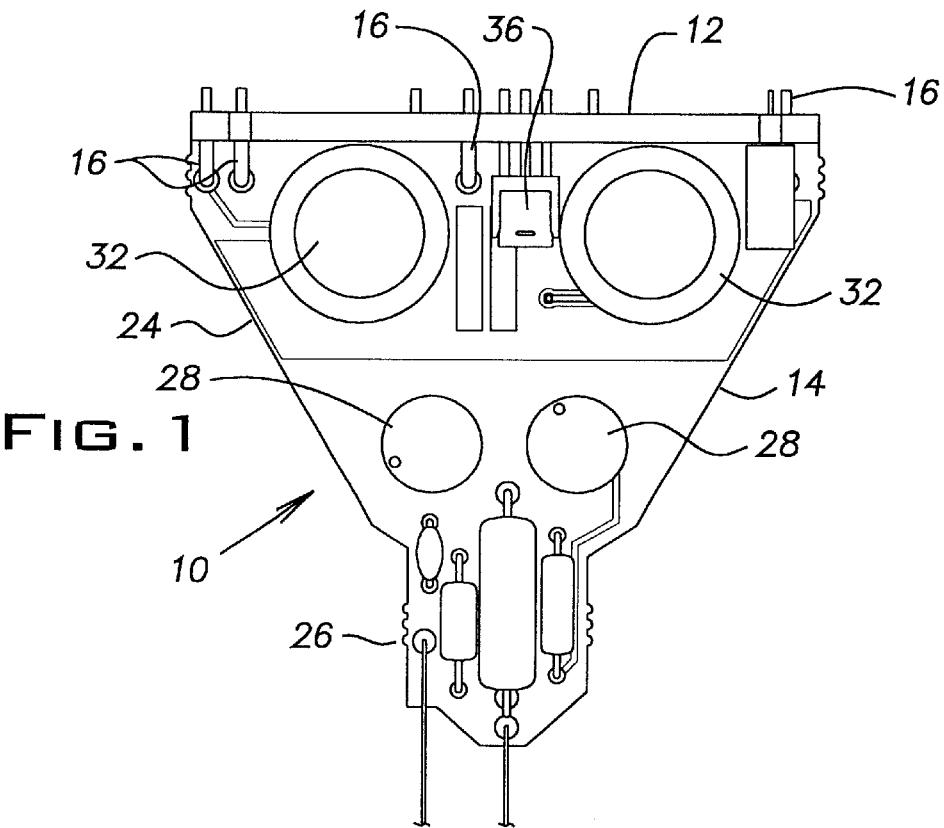
FIG. 1 is a front elevation view of an assembly according to the invention.
Figure 2:
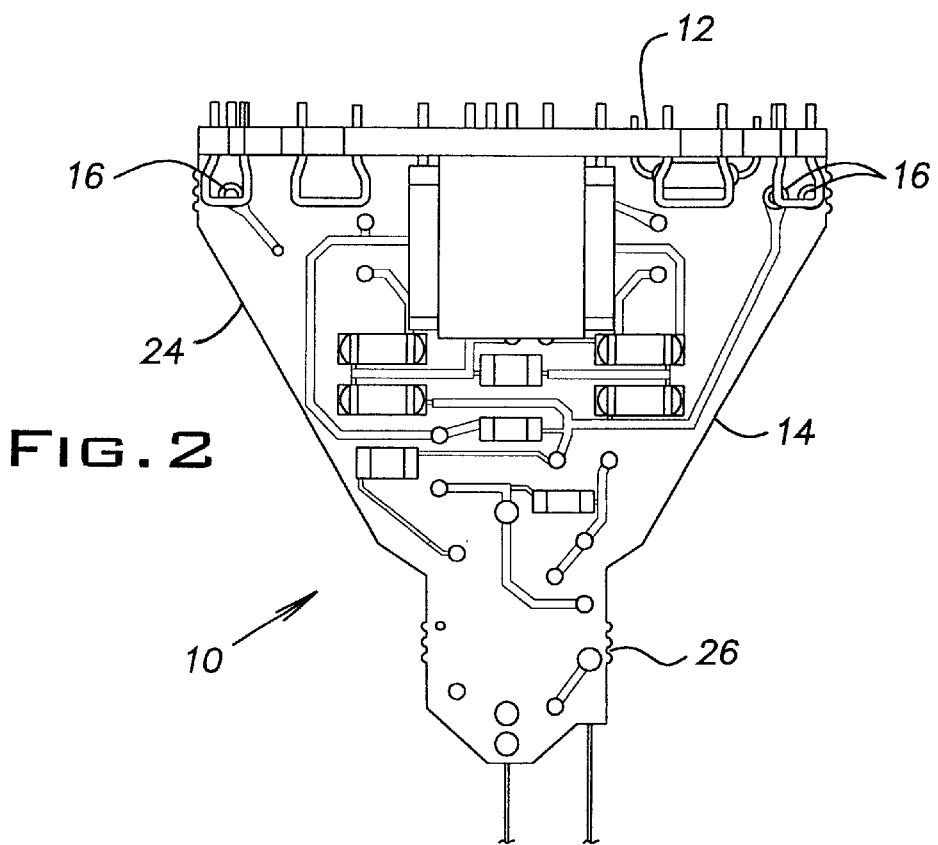
FIG. 2 is a rear elevation view of an assembly according to the invention.
Figure 3:
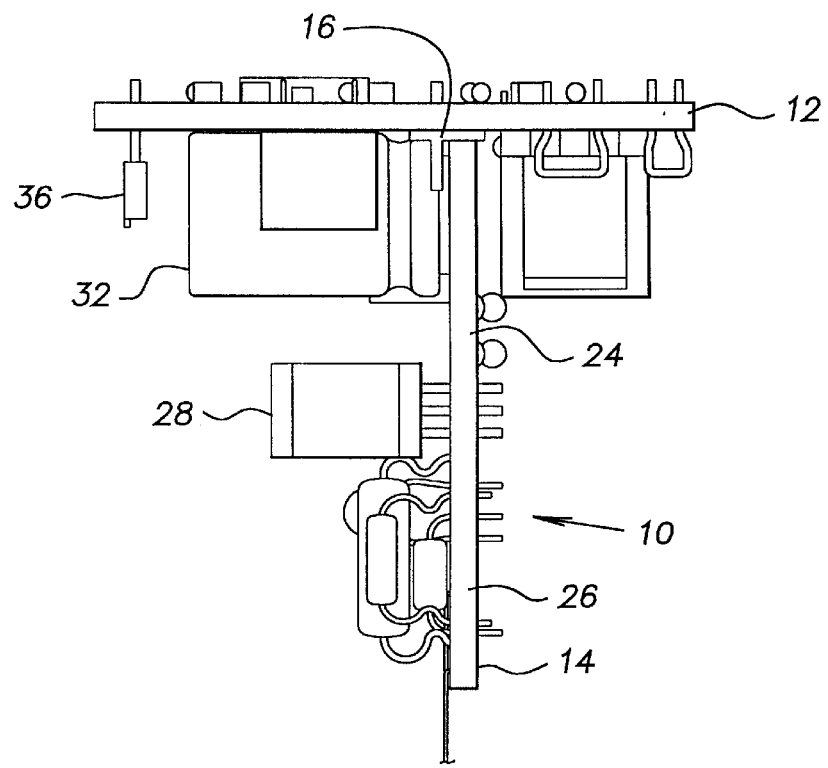
FIG. 3 is a right side elevation view of an assembly according to the invention.
Figure 4:
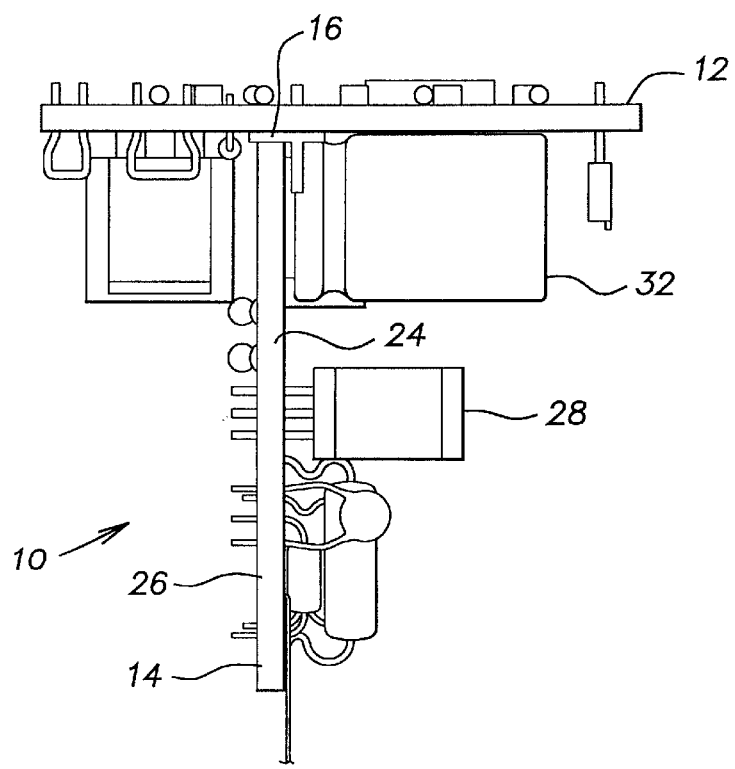
FIG. 4 is a left side elevation view of an assembly according to the invention.
Figure 5:
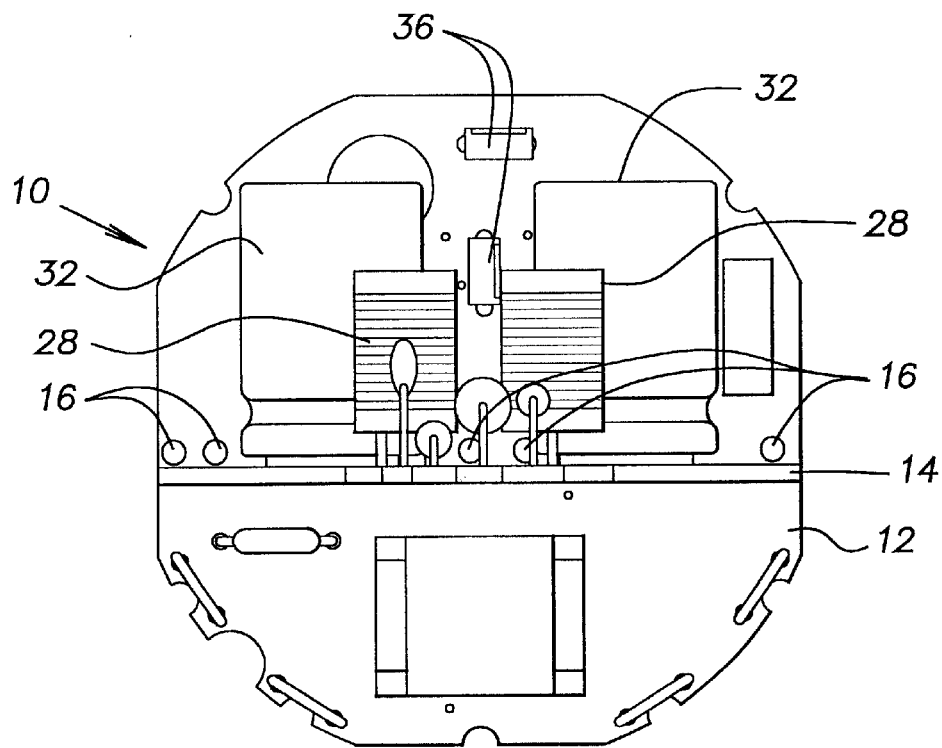
FIG. 5 is a top plan view of an assembly according to the invention.
Figure 6:
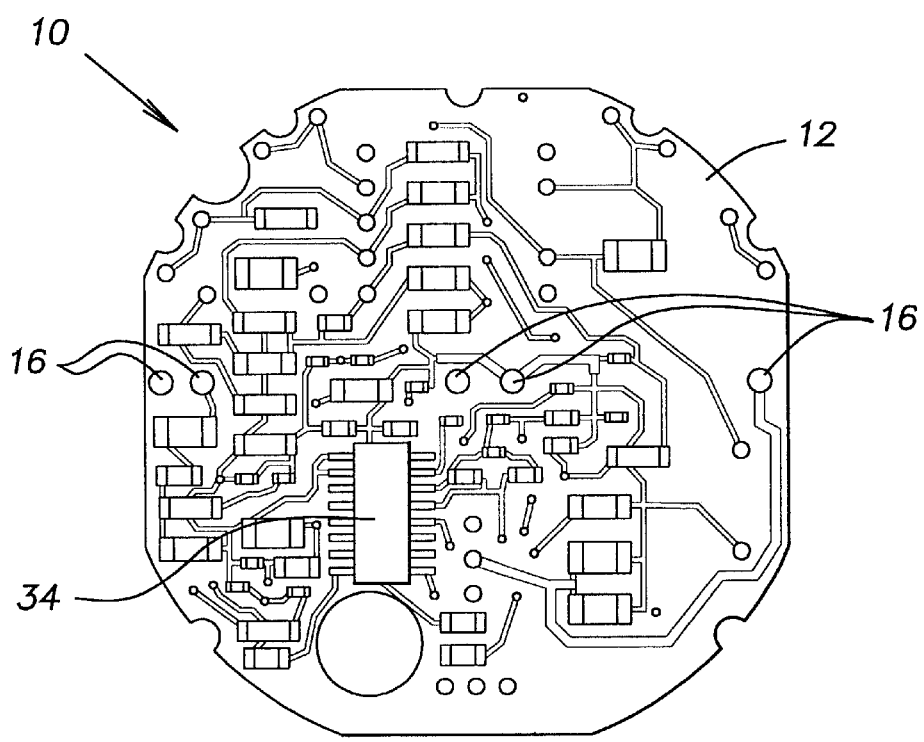
FIG. 6 is a bottom plan view an assembly according to the invention.
Figure 7:
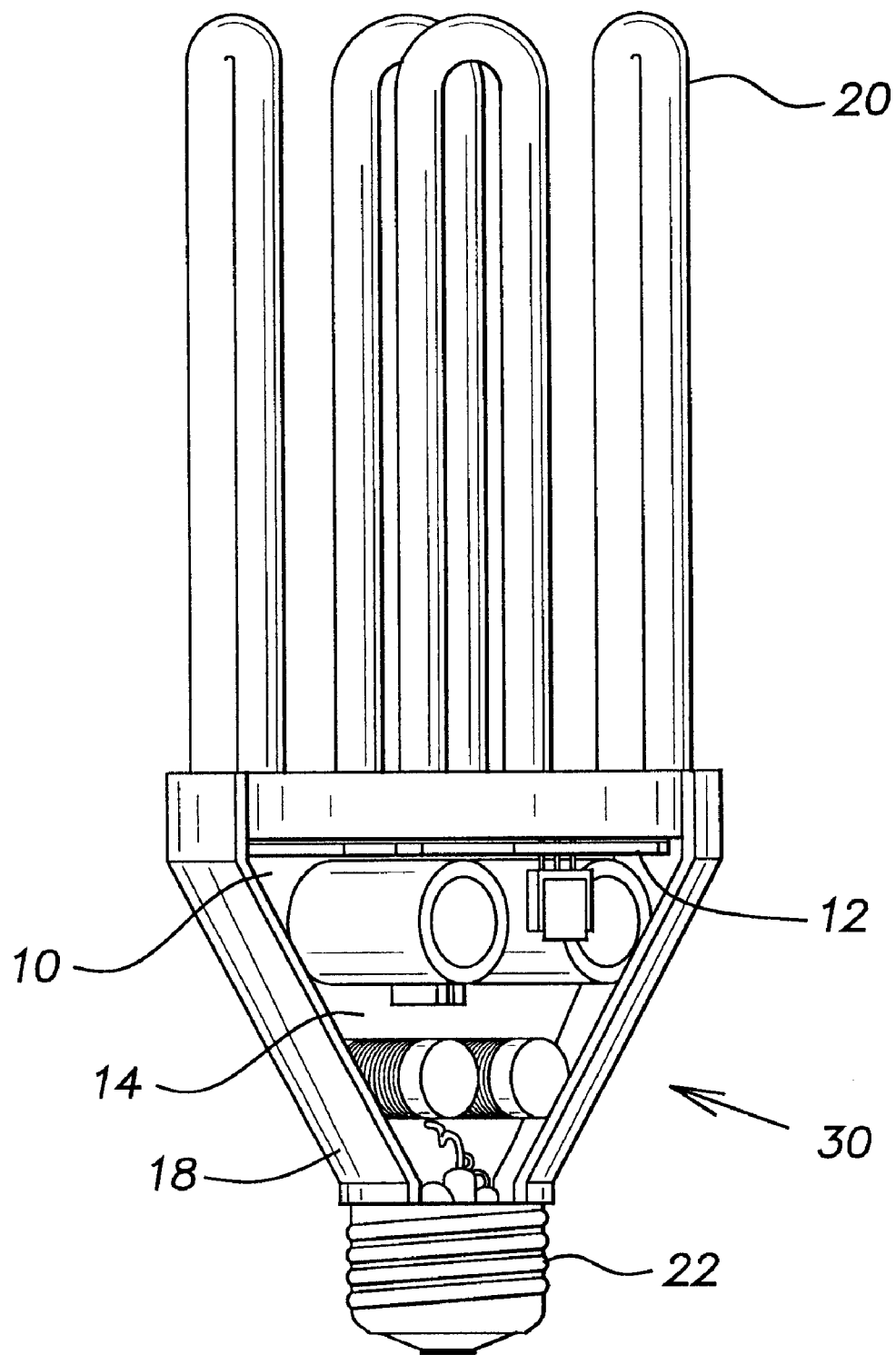
FIG. 7 is a perspective view of a compact florescent lamp unit with portions cut away to show an assembly according to the invention within the unit.

Referring to FIGS. 1–7, a printed wiring board assembly 10 for a compact fluorescent lamp unit 30 includes a first generally planar printed wiring board 12 and a second generally planar printed wiring board 14. The boards 12, 14 may be formed from, for example, glass fiber reinforced resin. Printed wiring or circuit traces may be, applied to the surfaces of the boards by methods well known in the art. Similarly, traces may also be incorporated within multiple layers within the boards 12, 14 and intercommunicate with other layers through such techniques as "plated-through" holes.

The board 12 may be advantageously attached to the board 14 by use of electrical connections 16 having sufficient mechanical strength to maintain the boards 12, 14 in a desired relative orientation. In the preferred embodiment, the board 14 is attached to the board 12 generally perpendicular to the board 12. The board 12 is in electrical communication with the board 14.

The board 12 may be, for example, generally circular and the board 14 may, for example, taper away from the board 12. Such a configuration allows the assembly 10 to fit within a cone-like housing 18.

The lamp portion 20 of the unit 30 is in electrical communication with the assembly 10. The base portion 22 of the unit 30 is also in communication with the assembly 10. The lamp portion may be, for example, mounted to the large diameter end of the housing 18 and the base portion may be, for example, mounted to the small diameter end of the housing 18.

The wide portion 24 of the board 14 is adjacent the lamp portion 20 and the narrow portion 26 is near the base portion 22.

The shape and configuration of the unit 30 allows its use in most existing incandescent bulb fixtures that use the familiar "light bulb" shape. The shape of the housing 18 allows the unit 30 to fit, for example, between the legs of the lamp shade harp common to many table and floor lamps. In addition, consumers have shown a preference for compact fluorescent lamp units that imitate the "light bulb" shape.

Consumers also desire compact fluorescent lamp units that include, for example, multiple output levels, including full range dimming. Providing these features increases the complexity, part count and size of the power supply/control circuits in these lamps. The assembly 10 allows the "light bulb" form factor to be maintained while still providing sufficient space for the necessary circuitry to provide the additional functionality.

Filtering components such as the inductors 28 may be mounted on the board 14 near the base portion 22. Mounting the filtering components of the circuitry of the assembly 10 near the base provides the best filtering of undesirable signals that could otherwise enter the mains that power the unit 30.

Heat sensitive components such as the electrolytic capacitors 32 may be mounted on the board 14. Mounting the heat sensitive components of the circuitry of the assembly 10 on the board 14 protects the heat sensitive components from the heat produced by the lamp portion 20.

Lamp control components such as logic circuitry 34 and power transistors 36 may be mounted on the board 12. The board 12 provides the desired space to mount the control components close to the lamp portion 20.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A printed wiring board assembly for a compact fluorescent lamp unit, said unit having a lamp portion and a base portion, said assembly comprising:
   a first generally planar wiring board containing a first group of electronic components electrically connected to said lamp portion, said first board having a width wider than said base portion; and
   a second generally planar wiring board containing a second group of electronic components electrically connected to said base portion, said first board being attached generally perpendicular to said second board and being in electrical communication with said second board, said second board tapering from a width generally equal to said first board width adjacent to said first board to a width narrower than said base portion towards said base portion.

2. An assembly according to claim 1, wherein heat sensitive components are mounted on said second board.

3. An assembly according to claim 1, wherein radio frequency filtering components are mounted on said second board, near said base portion.

4. An assembly according to claim 1, wherein lamp control components are mounted on said first board, near said lamp portion.

5. An assembly according to claim 1, wherein electrical connections between said boards provide mechanical support for attachment between said boards.

* * * * *